US012620891B2

(12) United States Patent
Gose

(10) Patent No.: US 12,620,891 B2
(45) Date of Patent: May 5, 2026

(54) SYSTEMS AND METHODS FOR THREE CHANNEL GALVANIC ISOLATOR FOR INVERTER FOR ELECTRIC VEHICLE

(71) Applicant: BorgWarner US Technologies LLC, Wilmington, DE (US)

(72) Inventor: Mark Wendell Gose, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 753 days.

(21) Appl. No.: 18/168,146

(22) Filed: Feb. 13, 2023

(65) Prior Publication Data

US 2024/0100968 A1    Mar. 28, 2024

Related U.S. Application Data

(60) Provisional application No. 63/378,601, filed on Oct. 6, 2022, provisional application No. 63/377,512, filed
(Continued)

(51) Int. Cl.
*H02M 7/49* (2007.01)
*H02M 1/00* (2006.01)
(Continued)

(52) U.S. Cl.
CPC ......... *H02M 1/327* (2021.05); *H02M 1/0054* (2021.05); *H02P 27/08* (2013.01);
(Continued)

(58) Field of Classification Search
CPC ......... H02M 7/49; H02M 1/327; H02P 27/08; H10W 40/641; H10W 72/07331
See application file for complete search history.

(56) References Cited

U.S. PATENT DOCUMENTS

| | | | |
|---|---|---|---|
| 4,054,828 A | 10/1977 | Conzelmann et al. | |
| 4,128,801 A | 12/1978 | Gansert et al. | |

(Continued)

FOREIGN PATENT DOCUMENTS

| | | |
|---|---|---|
| EP | 2157689 A1 | 2/2010 |
| JP | 2014023269 A | 2/2014 |

(Continued)

OTHER PUBLICATIONS

Balogh, L., "Fundamentals of MOSFET and IGBT Gate Driver Circuits," Texas Instruments Application Report, SLUA618-Mar. 2017, Retrieved from internet URL: https://ghioni.faculty.polimi.it/pel/readmat/gate-drive.pdf, 65 pages.
(Continued)

*Primary Examiner* — Cortez M Cook
(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: an upper phase multi-chip module including: a low-voltage upper phase controller; a high-voltage upper phase A controller; an upper phase A galvanic isolator connecting the low-voltage upper phase controller to the high-voltage upper phase A controller; a high-voltage upper phase B controller; an upper phase B galvanic isolator connecting the low-voltage upper phase controller to the high-voltage upper phase B controller; a high-voltage upper phase C controller; and an upper phase C galvanic isolator connecting the low-voltage upper phase controller to the high-voltage upper phase C controller.

20 Claims, 7 Drawing Sheets

Related U.S. Application Data on Sep. 28, 2022, provisional application No. 63/377,501, filed on Sep. 28, 2022, provisional application No. 63/377,486, filed on Sep. 28, 2022.

(51) Int. Cl.

| | |
|---|---|
| *H02M 1/32* | (2007.01) |
| *H02P 27/08* | (2006.01) |
| *H05K 7/20* | (2006.01) |
| *H10W 40/00* | (2026.01) |
| *H10W 40/22* | (2026.01) |
| *H10W 40/25* | (2026.01) |
| *H10W 40/43* | (2026.01) |
| *H10W 40/60* | (2026.01) |
| *H10W 40/77* | (2026.01) |
| *H10W 70/40* | (2026.01) |
| *H10W 70/60* | (2026.01) |
| *H10W 70/65* | (2026.01) |
| *H10W 90/00* | (2026.01) |
| *B60L 3/00* | (2019.01) |
| *B60L 15/00* | (2006.01) |
| *B60L 15/08* | (2006.01) |
| *B60L 15/20* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H02J 7/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 29/024* | (2016.01) |
| *H02P 29/68* | (2016.01) |
| *H03K 19/20* | (2006.01) |
| *H05K 1/14* | (2006.01) |
| *H05K 1/181* | (2026.01) |
| *H05K 1/182* | (2026.01) |
| *H05K 5/02* | (2006.01) |
| *H10D 64/01* | (2025.01) |
| *H10W 40/20* | (2026.01) |
| *H10W 40/47* | (2026.01) |
| *H10W 70/685* | (2026.01) |
| *H10W 70/692* | (2026.01) |
| *H10W 72/00* | (2026.01) |
| *H10W 72/30* | (2026.01) |

(52) U.S. Cl.
CPC ..... *H05K 7/20154* (2013.01); *H05K 7/20254* (2013.01); *H05K 7/2049* (2013.01); *H05K 7/20854* (2013.01); *H05K 7/209* (2013.01); *H05K 7/20927* (2013.01); *H10W 40/037* (2026.01); *H10W 40/22* (2026.01); *H10W 40/255* (2026.01); *H10W 40/43* (2026.01); *H10W 40/611* (2026.01); *H10W 40/641* (2026.01); *H10W 40/778* (2026.01); *H10W 70/481* (2026.01); *H10W 70/611* (2026.01); *H10W 70/65* (2026.01); *H10W 90/00* (2026.01); *B60L 3/003* (2013.01); *B60L 15/007* (2013.01); *B60L 15/08* (2013.01); *B60L 15/20* (2013.01); *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60L 2210/30* (2013.01); *B60L 2210/40* (2013.01); *B60L 2210/42* (2013.01); *B60L 2210/44* (2013.01); *B60L 2240/36* (2013.01); *B60R 16/02* (2013.01); *G01R 15/20* (2013.01); *G06F 1/08* (2013.01); *G06F 13/4004* (2013.01); *G06F 2213/40* (2013.01); *H02J 7/855* (2026.01); *H02J 2207/20* (2020.01); *H02M 1/0009* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/085* (2013.01); *H02P 29/024* (2013.01); *H02P 29/027* (2013.01); *H02P 29/68* (2016.02); *H02P 2207/05* (2013.01); *H03K 19/20* (2013.01); *H05K 1/145* (2013.01); *H05K 1/181* (2013.01); *H05K 1/182* (2013.01); *H05K 5/0247* (2013.01); *H05K 7/2039* (2013.01); *H05K 2201/042* (2013.01); *H05K 2201/10166* (2013.01); *H10D 64/018* (2025.01); *H10W 40/226* (2026.01); *H10W 40/235* (2026.01); *H10W 40/47* (2026.01); *H10W 40/60* (2026.01); *H10W 70/685* (2026.01); *H10W 70/692* (2026.01); *H10W 72/07331* (2026.01); *H10W 72/07354* (2026.01); *H10W 72/30* (2026.01); *H10W 72/347* (2026.01); *H10W 90/734* (2026.01); *H10W 90/736* (2026.01)

(56) References Cited

U.S. PATENT DOCUMENTS

| | | | |
|---|---|---|---|
| 4,564,771 | A | 1/1986 | Flohrs |
| 4,618,875 | A | 10/1986 | Flohrs |
| 4,716,304 | A | 12/1987 | Fiebig et al. |
| 5,068,703 | A | 11/1991 | Conzelmann et al. |
| 5,432,371 | A | 7/1995 | Denner et al. |
| 5,559,661 | A | 9/1996 | Meinders |
| 5,654,863 | A | 8/1997 | Davies |
| 5,764,007 | A | 6/1998 | Jones |
| 5,841,312 | A | 11/1998 | Mindl et al. |
| 6,028,470 | A | 2/2000 | Michel et al. |
| 6,163,138 | A | 12/2000 | Kohl et al. |
| 6,351,173 | B1 | 2/2002 | Ovens et al. |
| 6,426,857 | B1 | 7/2002 | Doster et al. |
| 6,597,556 | B1 | 7/2003 | Michel et al. |
| 6,812,553 | B2 | 11/2004 | Gerbsch et al. |
| 6,943,293 | B1 | 9/2005 | Jeter et al. |
| 7,095,098 | B2 | 8/2006 | Gerbsch et al. |
| 7,229,855 | B2 | 6/2007 | Murphy |

(56) References Cited

U.S. PATENT DOCUMENTS

| | | | |
|---|---|---|---|
| 7,295,433 | B2 | 11/2007 | Taylor et al. |
| 7,459,954 | B2 | 12/2008 | Kuehner et al. |
| 7,538,425 | B2 | 5/2009 | Myers et al. |
| 7,551,439 | B2 | 6/2009 | Peugh et al. |
| 7,616,047 | B2 | 11/2009 | Rees et al. |
| 7,724,046 | B2 | 5/2010 | Wendt et al. |
| 7,750,720 | B2 | 7/2010 | Dittrich |
| 9,088,159 | B2 | 7/2015 | Peuser |
| 9,275,915 | B2 | 3/2016 | Heinisch et al. |
| 9,373,970 | B2 | 6/2016 | Feuerstack et al. |
| 9,431,932 | B2 | 8/2016 | Schmidt et al. |
| 9,515,584 | B2 | 12/2016 | Koller et al. |
| 9,548,675 | B2 | 1/2017 | Schoenknecht |
| 9,806,607 | B2 | 10/2017 | Ranmuthu et al. |
| 9,843,320 | B2 | 12/2017 | Richter et al. |
| 9,871,444 | B2 | 1/2018 | Ni et al. |
| 9,882,490 | B2 | 1/2018 | Veeramreddi et al. |
| 10,111,285 | B2 | 10/2018 | Shi et al. |
| 10,116,300 | B2 | 10/2018 | Blasco et al. |
| 10,232,718 | B2 | 3/2019 | Trunk et al. |
| 10,270,354 | B1 | 4/2019 | Lu et al. |
| 10,291,225 | B2 | 5/2019 | Li et al. |
| 10,525,847 | B2 | 1/2020 | Strobel et al. |
| 10,797,579 | B2 | 10/2020 | Hashim et al. |
| 10,917,081 | B1 | 2/2021 | Nguyen et al. |
| 10,924,001 | B2 | 2/2021 | Li et al. |
| 11,082,052 | B2 | 8/2021 | Jang et al. |
| 11,108,389 | B2 | 8/2021 | Li et al. |
| 11,342,911 | B2 | 5/2022 | Lee et al. |
| 11,838,011 | B2 | 12/2023 | Li et al. |
| 11,843,320 | B2 | 12/2023 | Sivakumar et al. |
| 11,848,426 | B2 | 12/2023 | Zhang et al. |
| 11,851,038 | B2 | 12/2023 | Solanki et al. |
| 11,855,522 | B2 | 12/2023 | Rudolph et al. |
| 11,855,630 | B2 | 12/2023 | Dake et al. |
| 11,870,338 | B1 | 1/2024 | Narayanasamy |
| 11,872,997 | B2 | 1/2024 | Hoos et al. |
| 11,881,859 | B2 | 1/2024 | Gupta et al. |
| 11,888,391 | B2 | 1/2024 | Balasubramanian et al. |
| 11,888,393 | B2 | 1/2024 | Venkateswaran et al. |
| 11,901,803 | B2 | 2/2024 | Ruck et al. |
| 11,901,881 | B1 | 2/2024 | Narayanasamy |
| 11,909,319 | B2 | 2/2024 | Esteghlal et al. |
| 11,916,426 | B2 | 2/2024 | Oner et al. |
| 11,923,762 | B2 | 3/2024 | Sethumadhavan et al. |
| 11,923,764 | B1 | 3/2024 | Zhang |
| 11,923,799 | B2 | 3/2024 | Ojha et al. |
| 11,925,119 | B2 | 3/2024 | Male et al. |
| 11,927,624 | B2 | 3/2024 | Patel et al. |
| 11,938,838 | B2 | 3/2024 | Simonis et al. |
| 11,942,927 | B2 | 3/2024 | Purcarea et al. |
| 11,942,934 | B2 | 3/2024 | Ritter |
| 11,945,331 | B2 | 4/2024 | Blemberg et al. |
| 11,945,522 | B2 | 4/2024 | Matsumura et al. |
| 11,949,320 | B2 | 4/2024 | Jaladanki et al. |
| 11,949,333 | B2 | 4/2024 | Pahkala et al. |
| 11,955,896 | B2 | 4/2024 | Liu et al. |
| 11,955,953 | B2 | 4/2024 | Sinn et al. |
| 11,955,964 | B2 | 4/2024 | Agarwal et al. |
| 11,962,234 | B2 | 4/2024 | Narayanasamy et al. |
| 11,962,291 | B2 | 4/2024 | Oberdieck et al. |
| 11,964,587 | B2 | 4/2024 | Yukawa |
| 11,970,076 | B2 | 4/2024 | Sarfert et al. |
| 11,977,404 | B2 | 5/2024 | Chandrasekaran |
| 11,984,802 | B2 | 5/2024 | Merkin et al. |
| 11,984,876 | B2 | 5/2024 | Neidorff et al. |
| 11,990,776 | B2 | 5/2024 | Dulle |
| 11,990,777 | B2 | 5/2024 | Woll et al. |
| 11,996,686 | B2 | 5/2024 | Chan et al. |
| 11,996,699 | B2 | 5/2024 | Vasconcelos Araujo et al. |
| 11,996,714 | B2 | 5/2024 | El Markhi et al. |
| 11,996,715 | B2 | 5/2024 | Nandi et al. |
| 11,996,762 | B2 | 5/2024 | Hembach et al. |
| 11,996,830 | B2 | 5/2024 | Murthy et al. |
| 11,996,847 | B1 | 5/2024 | Kazama et al. |
| 12,003,191 | B2 | 6/2024 | Chaudhary et al. |
| 12,003,229 | B2 | 6/2024 | Kaya et al. |
| 12,003,237 | B2 | 6/2024 | Waters |
| 12,008,847 | B2 | 6/2024 | Braun et al. |
| 12,009,679 | B2 | 6/2024 | Gottwald et al. |
| 12,012,057 | B2 | 6/2024 | Schneider et al. |
| 12,015,342 | B2 | 6/2024 | Kienzler et al. |
| 12,019,112 | B2 | 6/2024 | Jarmolowitz et al. |
| 12,021,517 | B2 | 6/2024 | S et al. |
| 2009/0184760 | A1 | 7/2009 | Hauenstein |
| 2015/0364984 | A1 | 12/2015 | Miyauchi et al. |
| 2017/0250634 | A1 | 8/2017 | Ambruson et al. |
| 2017/0331469 | A1 | 11/2017 | Kilb et al. |
| 2020/0195121 | A1 | 6/2020 | Keskar et al. |
| 2021/0005711 | A1 | 1/2021 | Martinez-Limia et al. |
| 2021/0157299 | A1 | 5/2021 | Romig et al. |
| 2021/0242817 | A1* | 8/2021 | Huang ................... H02P 27/08 |
| 2021/0305207 | A1 | 9/2021 | Arora et al. |
| 2021/0408895 | A1* | 12/2021 | Kajiyama ............... H02M 7/49 |
| 2022/0052610 | A1 | 2/2022 | Plum |
| 2022/0200590 | A1 | 6/2022 | Ramond |
| 2022/0294441 | A1 | 9/2022 | Purcarea et al. |
| 2023/0010616 | A1 | 1/2023 | Gschwantner et al. |
| 2023/0061922 | A1 | 3/2023 | Ritter |
| 2023/0082076 | A1 | 3/2023 | Strache et al. |
| 2023/0126070 | A1 | 4/2023 | Oberdieck et al. |
| 2023/0179198 | A1 | 6/2023 | Winkler |
| 2023/0231210 | A1 | 7/2023 | Joos et al. |
| 2023/0231400 | A1 | 7/2023 | Oberdieck et al. |
| 2023/0231496 | A1 | 7/2023 | Syed et al. |
| 2023/0238808 | A1 | 7/2023 | Swoboda et al. |
| 2023/0268826 | A1 | 8/2023 | Yan et al. |
| 2023/0335509 | A1 | 10/2023 | Poddar |
| 2023/0365086 | A1 | 11/2023 | Schumacher et al. |
| 2023/0370062 | A1 | 11/2023 | Wolf |
| 2023/0378022 | A1 | 11/2023 | Kim et al. |
| 2023/0386963 | A1 | 11/2023 | Kim et al. |
| 2023/0402930 | A1 | 12/2023 | Corry et al. |
| 2023/0420968 | A1 | 12/2023 | Oner et al. |
| 2023/0421049 | A1 | 12/2023 | Neidorff |
| 2024/0006869 | A1 | 1/2024 | Kim et al. |
| 2024/0006899 | A1 | 1/2024 | Wernerus |
| 2024/0006993 | A1 | 1/2024 | Barjati et al. |
| 2024/0022187 | A1 | 1/2024 | Fassnacht |
| 2024/0022240 | A1 | 1/2024 | Balaz |
| 2024/0022244 | A1 | 1/2024 | S et al. |
| 2024/0030730 | A1 | 1/2024 | Wernerus |
| 2024/0039062 | A1 | 2/2024 | Wernerus |
| 2024/0039402 | A1 | 2/2024 | Bafna et al. |
| 2024/0039406 | A1 | 2/2024 | Chen et al. |
| 2024/0048048 | A1 | 2/2024 | Zhang |
| 2024/0055488 | A1 | 2/2024 | Lee et al. |
| 2024/0067116 | A1 | 2/2024 | Qiu |
| 2024/0072675 | A1 | 2/2024 | Formenti et al. |
| 2024/0072817 | A1 | 2/2024 | K et al. |
| 2024/0077899 | A1 | 3/2024 | Chitnis et al. |
| 2024/0078204 | A1 | 3/2024 | Roehrle et al. |
| 2024/0079950 | A1 | 3/2024 | Narayanasamy |
| 2024/0079958 | A1 | 3/2024 | Kumar et al. |
| 2024/0080028 | A1 | 3/2024 | Dake et al. |
| 2024/0088647 | A1 | 3/2024 | Ramadass et al. |
| 2024/0088896 | A1 | 3/2024 | Bilhan et al. |
| 2024/0097437 | A1 | 3/2024 | Goyal et al. |
| 2024/0097459 | A1 | 3/2024 | Swoboda et al. |
| 2024/0105276 | A1 | 3/2024 | Duryea |
| 2024/0106248 | A1 | 3/2024 | Woll et al. |
| 2024/0106435 | A1 | 3/2024 | Zhang et al. |
| 2024/0113517 | A1 | 4/2024 | Sriraj et al. |
| 2024/0113611 | A1 | 4/2024 | Kaufmann et al. |
| 2024/0113620 | A1 | 4/2024 | Ranmuthu et al. |
| 2024/0113624 | A1 | 4/2024 | Southard et al. |
| 2024/0120558 | A1 | 4/2024 | Zhang et al. |
| 2024/0120765 | A1 | 4/2024 | Oner et al. |
| 2024/0120962 | A1 | 4/2024 | Miriyala et al. |
| 2024/0128851 | A1 | 4/2024 | Ruck et al. |
| 2024/0128859 | A1 | 4/2024 | Chen |
| 2024/0128867 | A1 | 4/2024 | Wang et al. |
| 2024/0146177 | A1 | 5/2024 | Mehdi et al. |
| 2024/0146306 | A1 | 5/2024 | Ramkaj et al. |

(56) References Cited

U.S. PATENT DOCUMENTS

| | | |
|---|---|---|
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| WO | 2007093598 A1 | 8/2007 |
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

* cited by examiner

SYSTEMS AND METHODS FOR THREE CHANNEL GALVANIC ISOLATOR FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377, 501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for a three channel galvanic isolator for an inverter for an electric vehicle, and, more particularly, to systems and methods for a three channel galvanic isolator for an integrated gate driver for power device switches for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, a gate driver for a power device switch may operate in a high voltage and electrically noisy environment, which may affect an operation of the gate driver and/or power device switches, and therefore may affect an operation of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: an upper phase multi-chip module including: a low-voltage upper phase controller; a high-voltage upper phase A controller; an upper phase A galvanic isolator connecting the low-voltage upper phase controller to the high-voltage upper phase A controller; a high-voltage upper phase B controller; an upper phase B galvanic isolator connecting the low-voltage upper phase controller to the high-voltage upper phase B controller; a high-voltage upper phase C controller; and an upper phase C galvanic isolator connecting the low-voltage upper phase controller to the high-voltage upper phase C controller.

In some aspects, the techniques described herein relate to a system, wherein the inverter further includes: a point-of-use upper phase A controller configured to be connected to the high-voltage upper phase A controller; a point-of-use upper phase B controller configured to be connected to the high-voltage upper phase B controller; and a point-of-use upper phase C controller configured to be connected to the high-voltage upper phase C controller.

In some aspects, the techniques described herein relate to a system, wherein the inverter further includes: an upper phase A power switch connected to the point-of-use upper phase A controller, and configured to be connected to a positive connection of the battery and a phase A connection of the motor; an upper phase B power switch connected to the point-of-use upper phase B controller, and configured to be connected to the positive connection of the battery and a phase B connection of the motor; and an upper phase C power switch connected to the point-of-use upper phase C controller, and configured to be connected to the positive connection of the battery and a phase C connection of the motor.

In some aspects, the techniques described herein relate to a system, wherein the inverter further includes: a lower phase multi-chip module including: a low-voltage lower phase controller; a high-voltage lower phase A controller; a lower phase A galvanic isolator connecting the low-voltage lower phase controller to the high-voltage lower phase A controller; a high-voltage lower phase B controller; a lower phase B galvanic isolator connecting the low-voltage lower phase controller to the high-voltage lower phase B controller; a high-voltage lower phase C controller; and a lower phase C galvanic isolator connecting the low-voltage lower phase controller to the high-voltage lower phase C controller.

In some aspects, the techniques described herein relate to a system, wherein the inverter further includes: a point-of-use lower phase A controller configured to be connected to the high-voltage lower phase A controller; a point-of-use lower phase B controller configured to be connected to the high-voltage lower phase B controller; and a point-of-use lower phase C controller configured to be connected to the high-voltage lower phase C controller.

In some aspects, the techniques described herein relate to a system, wherein the inverter further includes: a lower phase A power switch connected to the point-of-use lower phase A controller, and configured to be connected to a negative connection of the battery and a phase A connection of the motor; a lower phase B power switch connected to the point-of-use lower phase B controller, and configured to be connected to the negative connection of the battery and a phase B connection of the motor; and a lower phase C power switch connected to the point-of-use lower phase C controller, and configured to be connected to the negative connection of the battery and a phase C connection of the motor.

In some aspects, the techniques described herein relate to a system, wherein the inverter further includes: a phase A power module configured to be connected to the high-voltage upper phase A controller; a phase B power module configured to be connected to the high-voltage upper phase B controller; and a phase C power module configured to be connected to the high-voltage upper phase C controller.

In some aspects, the techniques described herein relate to a system, further including: the battery configured to supply the DC power to the inverter; and the motor configured to receive the AC power from the inverter to drive the motor.

In some aspects, the techniques described herein relate to a system including: a multi-chip module for an inverter, the multi-chip module including: a low-voltage controller; a first high-voltage controller; a first galvanic isolator connecting the low-voltage controller to the first high-voltage controller; a second high-voltage controller; a second galvanic isolator connecting the low-voltage controller to the second high-voltage controller; a third high-voltage controller; and a third galvanic isolator connecting the low-voltage controller to the third high-voltage controller.

In some aspects, the techniques described herein relate to a system, wherein the low-voltage controller is configured to communicate with a pulse-width-modulation controller of the inverter.

In some aspects, the techniques described herein relate to a system, wherein: the first high-voltage controller is configured to communicate with a first point-of-use controller on a first power module of the inverter; the second high-voltage controller is configured to communicate with a second point-of-use controller on a second power module of the inverter; and the third high-voltage controller is configured to communicate with a third point-of-use controller on a third power module of the inverter.

In some aspects, the techniques described herein relate to a system, wherein: the low-voltage controller is configured to receive a first control signal from the pulse-width-modulation controller, and, based on the first control signal, send a first gate control signal to the first high-voltage controller via the first galvanic isolator; the low-voltage controller is configured to receive a second control signal from the pulse-width-modulation controller, and, based on the second control signal, send a second gate control signal to the second high-voltage controller via the second galvanic isolator; and the low-voltage controller is configured to receive a third control signal from the pulse-width-modulation controller, and, based on the third control signal, send a third gate control signal to the third high-voltage controller via the third galvanic isolator.

In some aspects, the techniques described herein relate to a system, wherein: the first high-voltage controller is configured to send the first gate control signal to the first point-of-use controller on the first power module of the inverter; the second high-voltage controller is configured to send the second gate control signal to the second point-of-use controller on the second power module of the inverter; and the third high-voltage controller is configured to send the third gate control signal to the third point-of-use controller on the third power module of the inverter.

In some aspects, the techniques described herein relate to a system, wherein: the first high-voltage controller is configured to receive a first feedback signal from the first point-of-use controller on the first power module of the inverter, and send the first feedback signal to the low-voltage controller; the second high-voltage controller is configured to receive a second feedback signal from the second point-of-use controller on the second power module of the inverter, and send the second feedback signal to the low-voltage controller; and the third high-voltage controller is configured to receive a third feedback signal from the third point-of-use controller on the third power module of the inverter, and send the third feedback signal to the low-voltage controller.

In some aspects, the techniques described herein relate to a system including: an inverter configured to convert DC power from a battery to AC power to drive a motor, wherein the inverter includes: an upper phase controller including a low voltage upper phase controller, a first high-voltage upper phase controller, a second high-voltage upper phase controller, and a third high-voltage upper phase controller; a lower phase controller including a low voltage lower phase controller, a first high-voltage lower phase controller, a second high-voltage lower phase controller, and a third high-voltage lower phase controller; a first power module including a first upper phase point-of-use controller, a first upper phase switch, a first lower phase point-of-use controller, and a first lower phase switch; a second power module including a second upper phase point-of-use controller, a second upper phase switch, a second lower phase point-of-use controller, and a second lower phase switch; and a third power module including a third upper phase point-of-use controller, a third upper phase switch, a third lower phase point-of-use controller, and a third lower phase switch.

In some aspects, the techniques described herein relate to a system, wherein: the upper phase controller is configured to communicate with a pulse-width-modulation controller of the inverter, and is configured to communicate with the lower phase controller, and the lower phase controller is configured to communicate with the pulse-width-modulation controller of the inverter, and is configured to communicate with the upper phase controller.

In some aspects, the techniques described herein relate to a system, wherein: the first high-voltage upper phase controller includes a first upper phase galvanic isolator connected to the low voltage upper phase controller; the second high-voltage upper phase controller includes a second upper phase galvanic isolator connected to the low voltage upper phase controller; the third high-voltage upper phase controller includes a third upper phase galvanic isolator connected to the low voltage upper phase controller; the first high-voltage lower phase controller includes a first lower phase galvanic isolator connected to the low voltage lower phase controller; the second high-voltage lower phase controller includes a second lower phase galvanic isolator connected to the low voltage lower phase controller; and the third high-voltage lower phase controller includes a third lower phase galvanic isolator connected to the low voltage lower phase controller.

In some aspects, the techniques described herein relate to a system, wherein: the first high-voltage upper phase controller is configured to be connected to the first upper phase point-of-use controller; the second high-voltage upper phase controller is configured to be connected to the second upper phase point-of-use controller; the third high-voltage upper phase controller is configured to be connected to the third upper phase point-of-use controller; the first high-voltage lower phase controller is configured to be connected to the first lower phase point-of-use controller; the second high-voltage lower phase controller is configured to be connected to the second lower phase point-of-use controller; and the third high-voltage lower phase controller is configured to be connected to the third lower phase point-of-use controller.

In some aspects, the techniques described herein relate to a system, wherein: the first upper phase point-of-use controller is configured to control the first upper phase switch based on one or more first upper phase signals from the first high-voltage upper phase controller; the second upper phase point-of-use controller is configured to control the second upper phase switch based on one or more second upper phase signals from the second high-voltage upper phase controller; the third upper phase point-of-use controller is configured to control the third upper phase switch based on one or more third upper phase signals from the third high-voltage upper phase controller; the first lower phase point-of-use controller is configured to control the first lower phase switch based on one or more first lower phase signals from the first high-voltage lower phase controller; the second lower phase point-of-use controller is configured to control the second lower phase switch based on one or more second lower phase signals from the second high-voltage lower phase controller; and the third lower phase point-of-use controller is configured to control the third lower phase switch based on one or more third lower phase signals from the third high-voltage lower phase controller.

In some aspects, the techniques described herein relate to a system, wherein: the first upper phase switch is configured to be connected to a positive connection of the battery and a first phase connection of the motor; the second upper phase switch is configured to be connected to a positive connection of the battery and a second phase connection of the motor;

the third upper phase switch is configured to be connected to a positive connection of the battery and a third phase connection of the motor; the first lower phase switch is configured to be connected to a negative connection of the battery and the first phase connection of the motor; the second lower phase switch is configured to be connected to a negative connection of the battery and the second phase connection of the motor; and the third lower phase switch is configured to be connected to a negative connection of the battery and the third phase connection of the motor.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
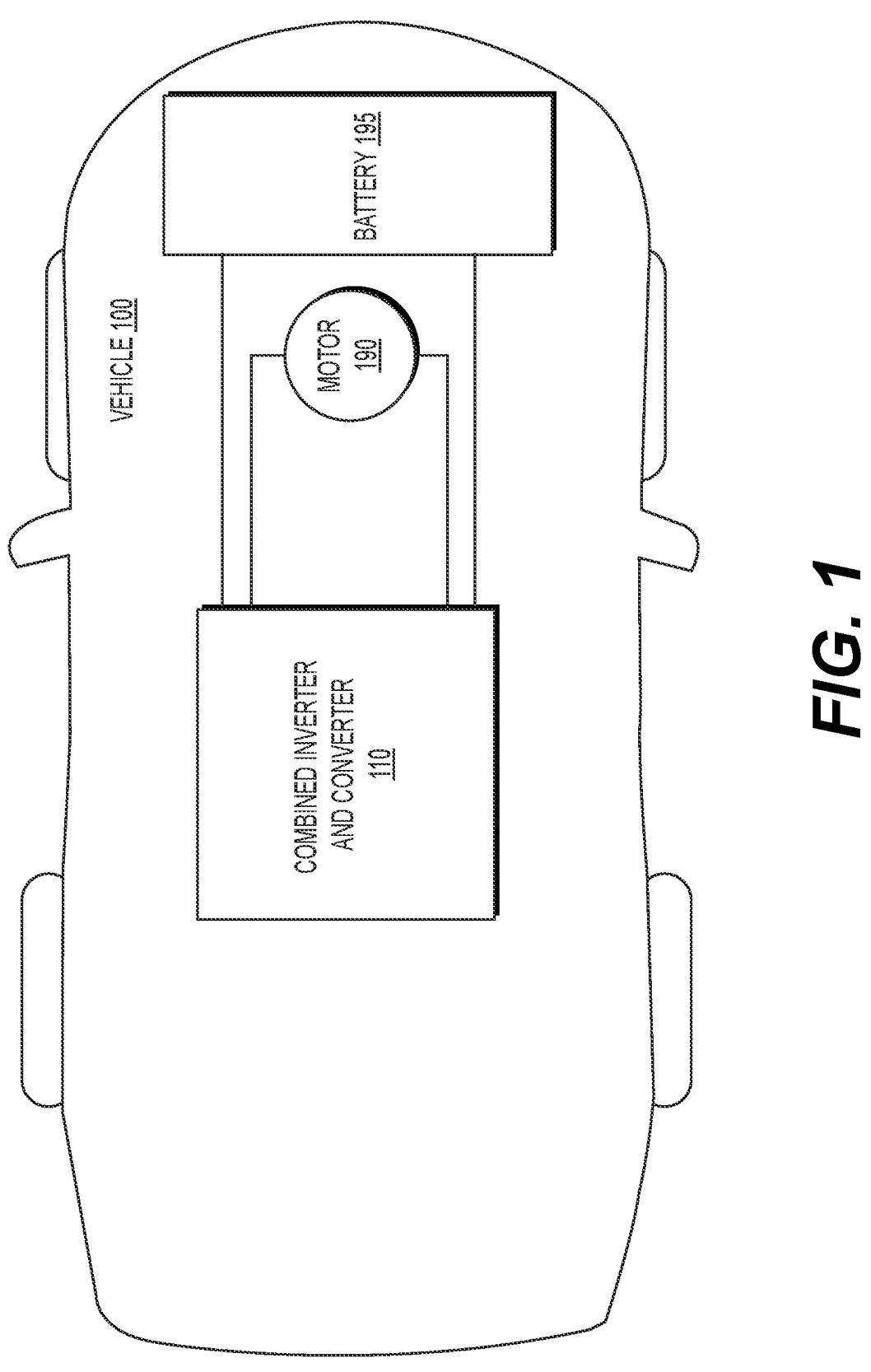
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for a three channel galvanic isolator for an inverter for an electric vehicle, and, more particularly, to systems and methods for a three channel galvanic isolator for an integrated gate driver for power device switches for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5A to 15A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

Isolated gate drivers may include two or more integrated circuits (ICs) in a single package. For example, in the case of a two IC implementation, a first IC is referenced to chassis ground, and a second IC is referenced to a floating supply referenced to the source of the FET or IGBT being driven. In the case of a three IC implementation, a first IC is referenced to chassis ground, a second IC is referenced to a floating supply referenced to the source of a first FET or IGBT, such as the high side of a phase switch, and a third IC is referenced to a floating supply referenced to the source of a second FET or IGBT, such as the low side of a phase switch. A low voltage IC (LVIC) may interface to circuitry referenced to a chassis ground in a low voltage domain, and other ICs, such as high voltage IC (HVIC), may interface to circuitry referenced to one or more high voltage domains. Some isolated gate drivers may include one LVIC and one or two HVICs. Internal wire bonds may connect the LVIC and HVIC within the package. These internal wire bonds may connect to a high voltage element, such as a transformer or capacitor, on one or both of the LVIC and HVIC, to create galvanic isolation between the low voltage domain and the high voltage domain. AC signals are passed through this high voltage element to provide a communication pathway between the low voltage domain and the high voltage domain. This communication pathway provides the galvanic isolation required as a safety element of the system.

Some systems have one isolated gate driver per power switch, and the isolated gate driver is remote from the power module. Some power switches include silicon carbide (SiC) FETs, and the isolated gate drivers are located remotely from the SiC FETs in the power switch. The routing from the isolated gate driver to the power switch may make sensing the gate-to source voltage of the SiC FETs accurately during turn-on and turn-off events of the SiC FETs difficult, due to parasitic inductance in the gate and source traces, which results in induced voltages across the gate and source traces. Some isolated gate drivers measure a power switch temperature remotely by using a sensor, such as a diode or thermistor, onboard the power switch. This sensor itself may provide a point temperature measurement that may differ from an actual SiC temperature by a substantial margin, with further error caused by noise incurred by long traces or lead length from the sensor to the isolated gate driver. In an isolated gate driver system, a desaturation circuit may provide short circuit protection by sensing when a voltage across the power switch is too large after the SiC FET has been fully enhanced. This short circuit protection may result in large current and/or temperature transients within the SiC die, which may stress the SiC die. This short circuit protection may require significant external components to protect and bias drain sensing circuitry of the isolated gate driver. Gate drivers that use one LVIC with two HVICs to drive one half-H element (both upper and lower phases) may compromise system safety, as both an upper driver and lower driver may be compromised in a failure event. Some systems may include six galvanically isolated gate drivers for a typical three phase inverter, which may consume significant board area.

One or more embodiments may integrate a gate driver into the power switch, as an integrated gate driver or point-of-use controller. The integrated gate driver may be an application-specific integrated circuit (ASIC), for example.

A phase switch power module that includes two switches may incorporate two integrated gate drivers, with a gate driver for each switch. One or more embodiments may locally sense current of a SiC die by sensing a voltage drop across the source metallization. One or more embodiments may include local precision thermal sensing of the SiC die and an environment of the SiC die, without the need for integrated on die temperature sense circuitry, which may provide improved die thermal performance or lower die cost. One or more embodiments may closely couple gate drive circuitry to the SiC bare die that makes up the power switch, which may reduce switching losses. One or more embodiments may include a gate drive profile as a function of one or more of SiC FET gate-to-source voltage, temperature, or known gate-to-source voltage thresholds that may change over the life of the SiC FET. One or more embodiments may measure and store specific SiC device characteristics in a memory, such as an EEPROM, for example, of the integrated gate driver, and may provide custom tailored gate drive profiles based on the stored SiC device characteristics. One or more embodiments may use a two-wire bus for communication, which may reduce a number of connections to a galvanic isolated device. One or more embodiments may provide a three HVIC to one LVIC using a first multi-chip module for upper switches of a three-phase bridge and a second multi-chip module for lower switches of a three-phase bridge.

One or more embodiments may provide a single multi-chip module package component with three galvanically isolated channels that interface between the low voltage chassis referenced ground domain and each of three integrated gate drivers located in the high voltage battery domain. This three channel configuration may provide an architecture with one package part controlling either the three upper phase switches or three lower phase switches of a three-phase inverter. One or more embodiments may provide an improved arrangement from a functional safety standpoint, as safe responses for an inverter may include either three phase short of the upper or lower switches or a six-switch open condition. For example, a single point failure that affects the multi-chip module controlling the three upper switches may allow a safe state to be entered by the lower multi-chip module executing a three-phase short on the lower three switches. One or more embodiments may reduce a number of packaged galvanic isolators placed in the system from some system requirements of six, in the case of a three-phase system, to two multi-chip modules. One or more embodiments may reduce a number of Serial Peripheral Interface (SPI) connections to control a three-phase switch.

One or more embodiments may provide a single package, three channel configuration that may drive either upper phase or lower phase switches. One or more embodiments may provide distinct advantages over some single isolated gate drive per switch configurations. A first advantage may be shared circuitry between three isolated channels in the low voltage or chassis ground referenced integrated circuit, compared to duplicated circuitry on each of the low voltage or chassis ground referenced integrated circuits for the three individual isolated gate drivers. A second advantage may be a single SPI interface to the microprocessor for the three upper phase or lower phase switches, compared to a duplicated SPI interfaces for the three individual isolated gate drivers. A third advantage may be reduced test times for a single channel three package configuration compared to three single channel isolated gate drivers. A fourth advantage may be a reduced footprint for a printed circuit board layout for a single channel three package configuration compared to three single channel isolated gate drivers.

One or more embodiments may provide direct current sensing, which may provide less stress on SiC devices in the event of a short circuit event. One or more embodiments may provide precise temperature measurement, which may allow operation at a higher average temperature for system optimization. One or more embodiments may reduce switching losses due to one or more of a tightly coupled layout, usage of SiC device characteristics, usage of temperature, and usage of previous cycle current. Reduced switching losses may provide an increased range for an electric vehicle. Reduced switching losses may provide a higher current output of the power switch or module. One or more embodiments may provide safety independence as required in permanent magnet machines for active short circuit discharge during device failure.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
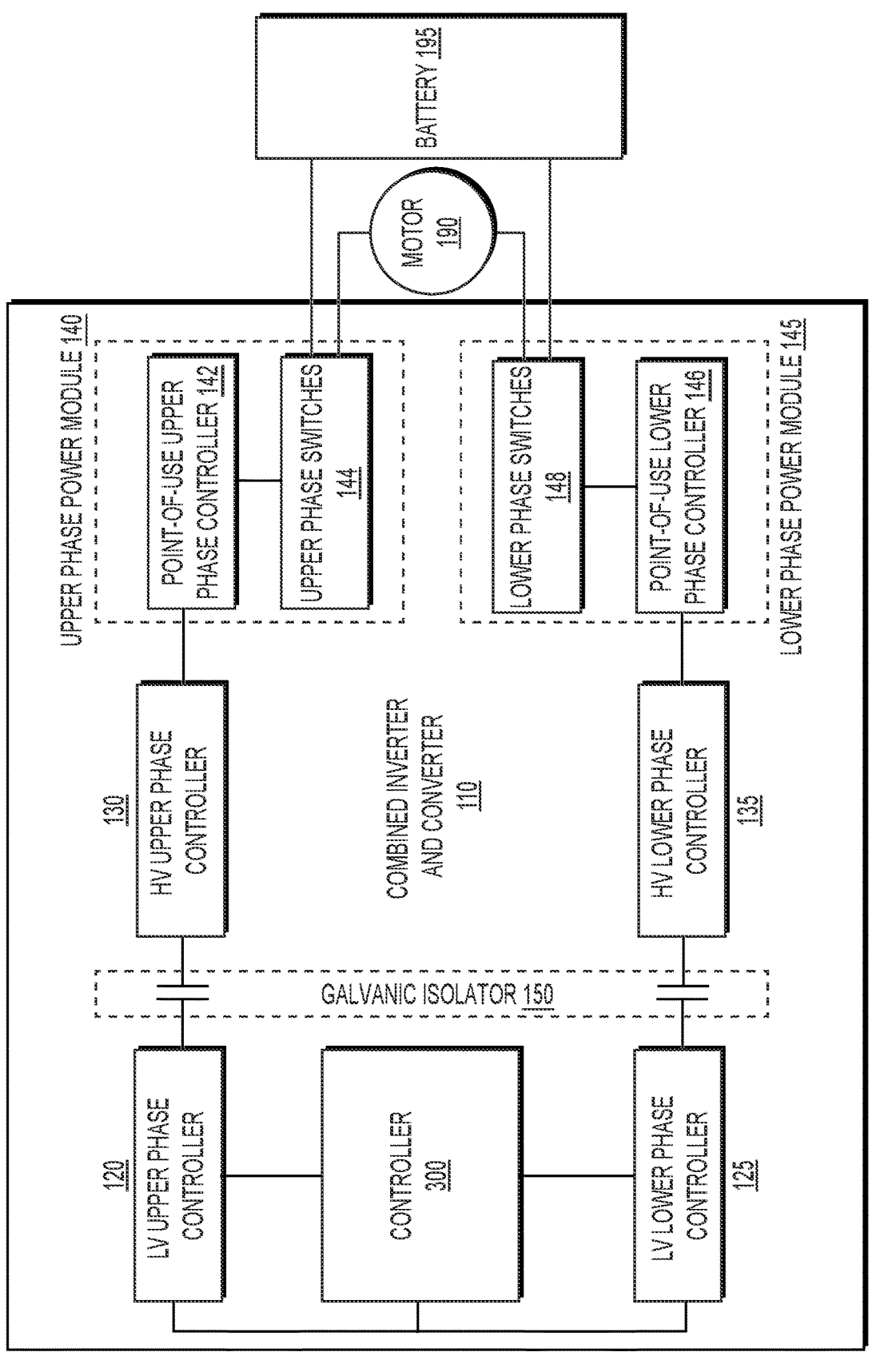
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
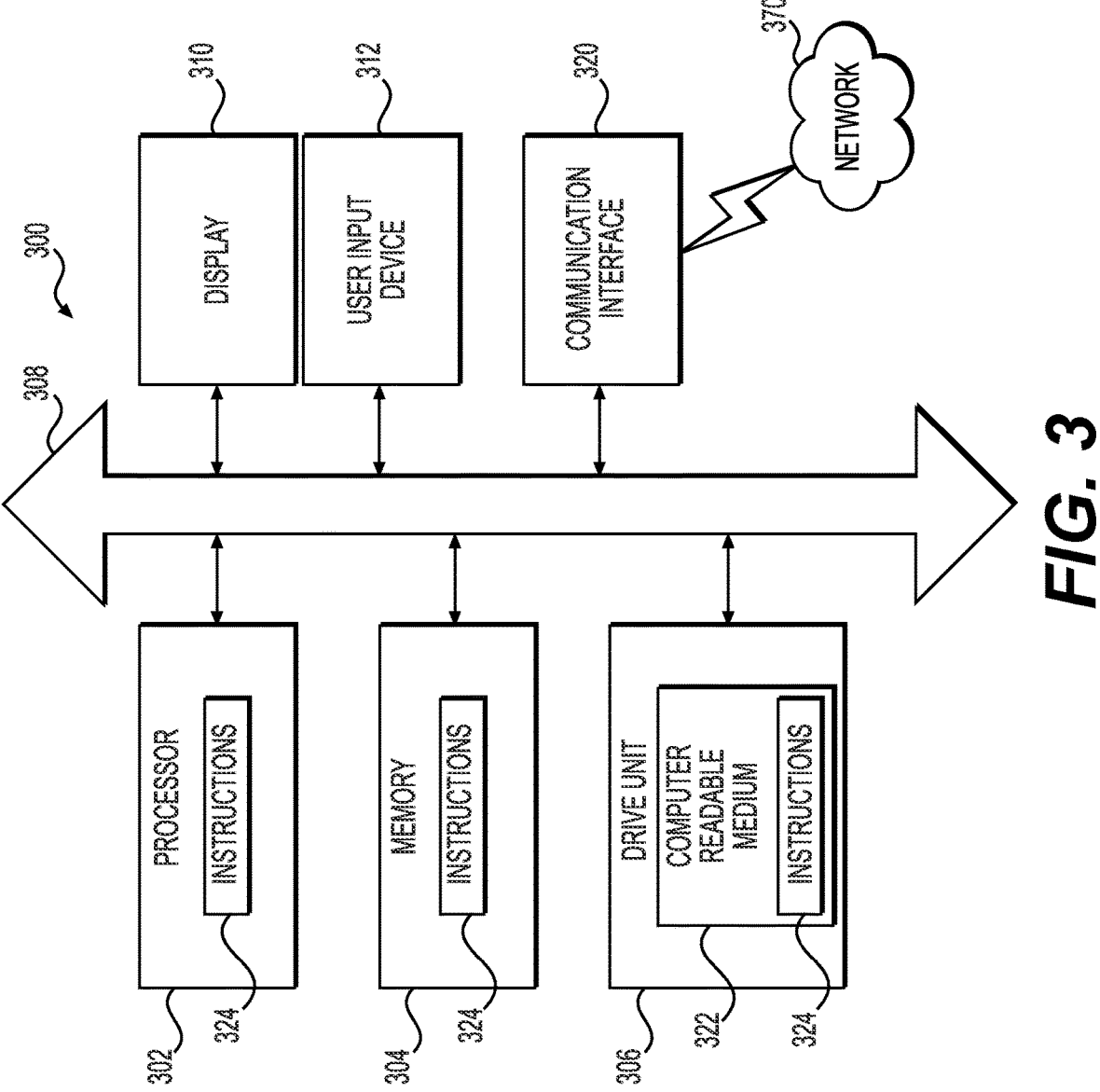
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems.

For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
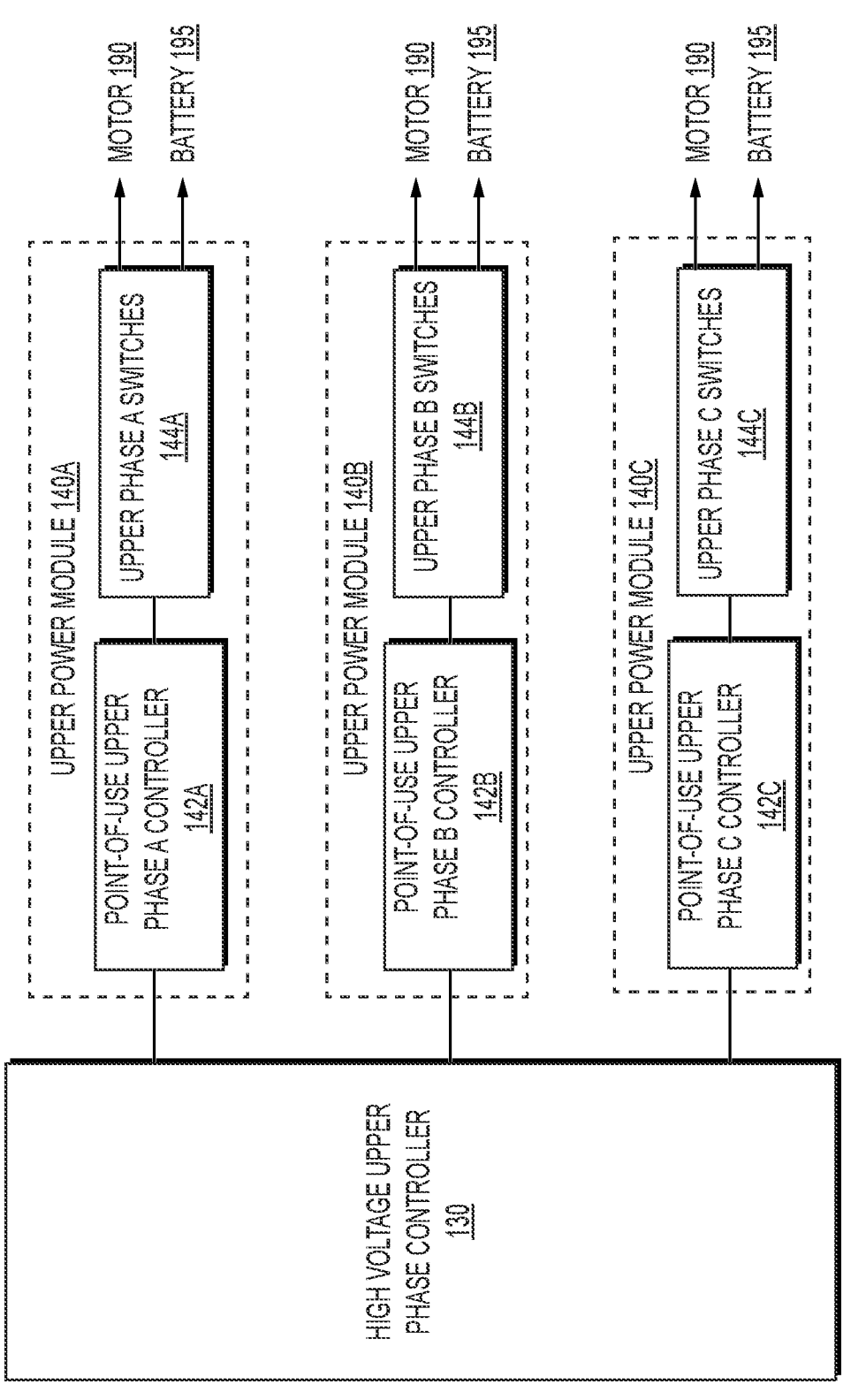
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
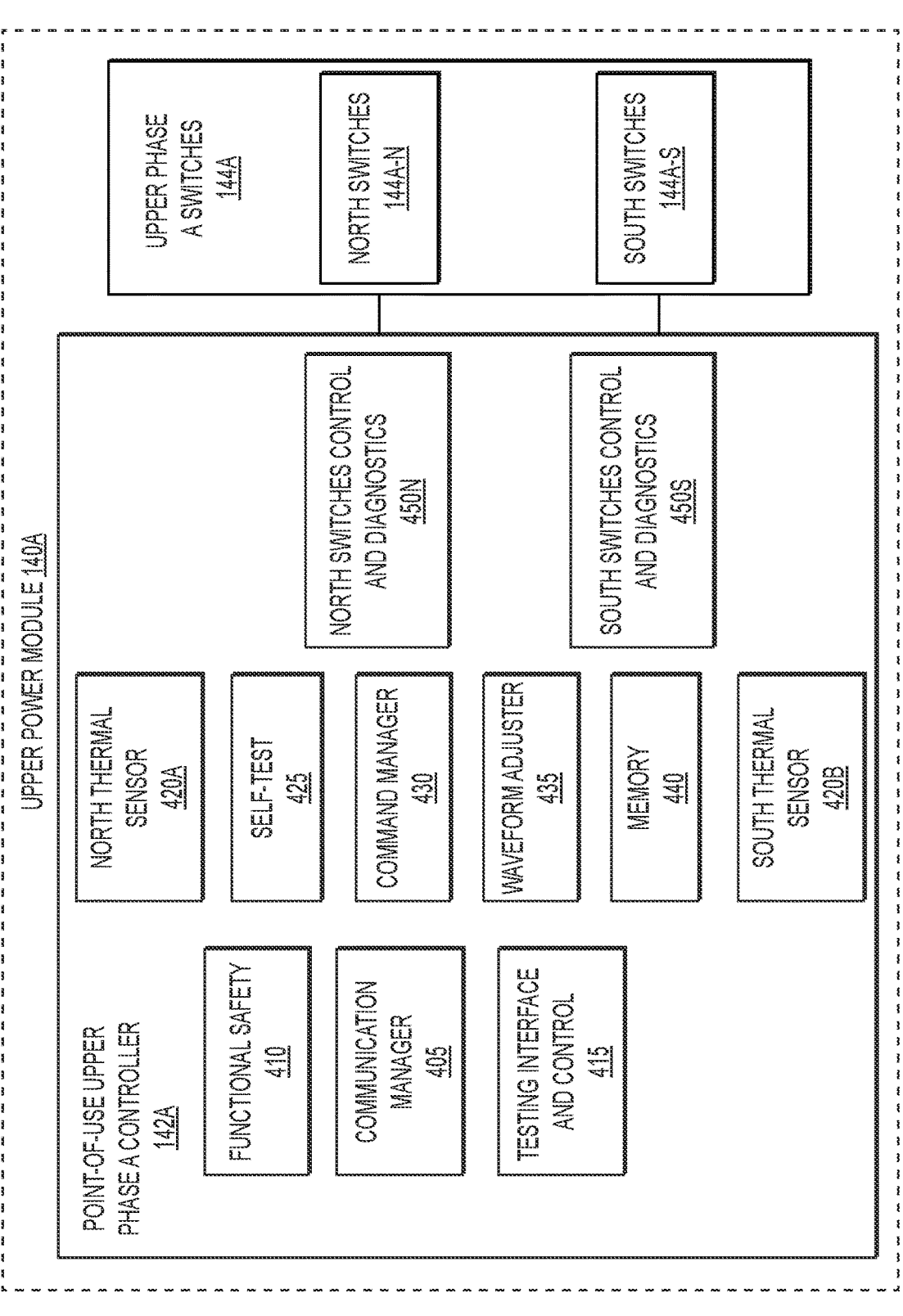
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
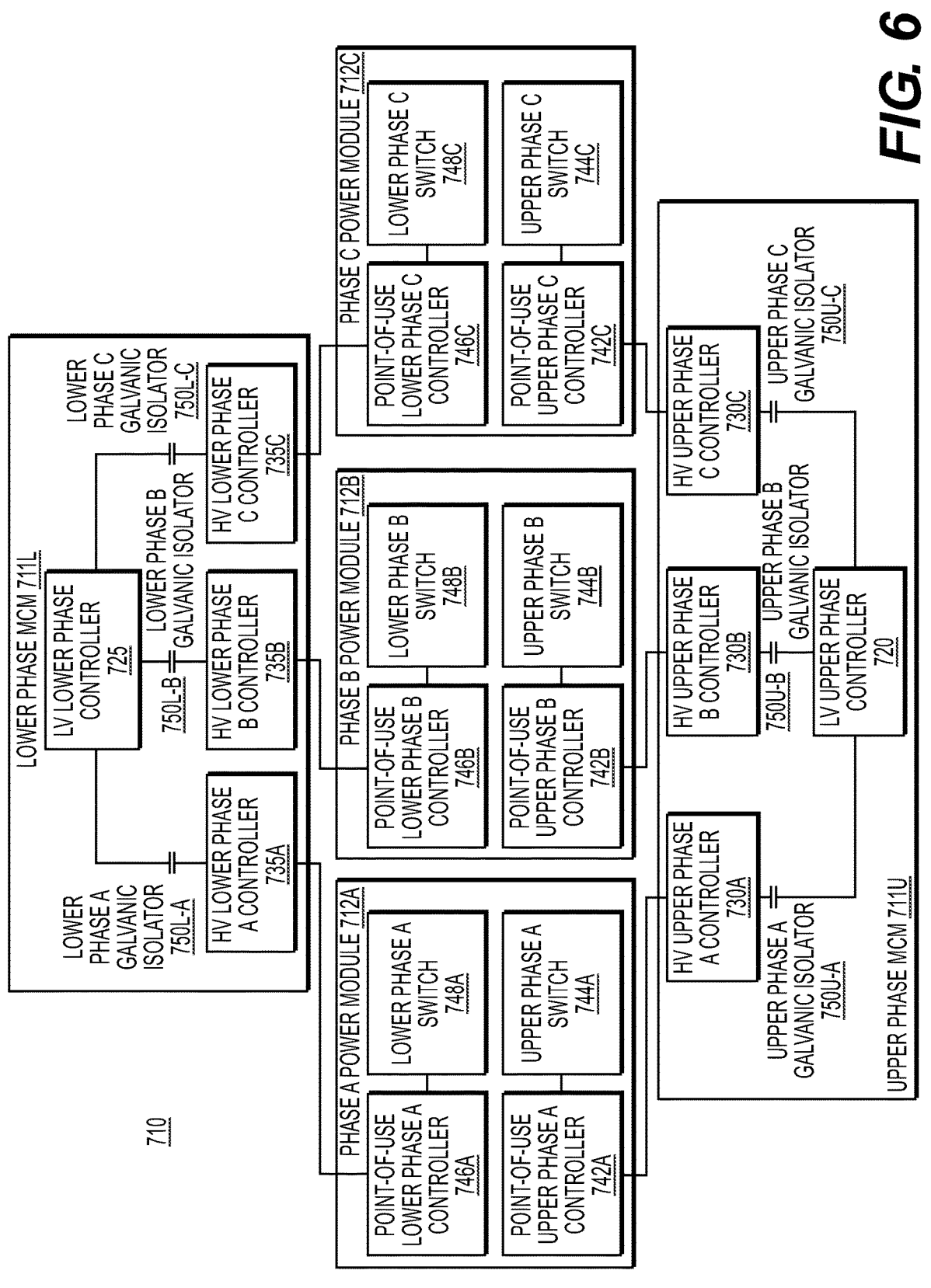
FIG. 6 depicts an exemplary block diagram for a system including a three channel galvanic isolator and an integrated gate driver architecture, according to one or more embodiments.
Figure 7:
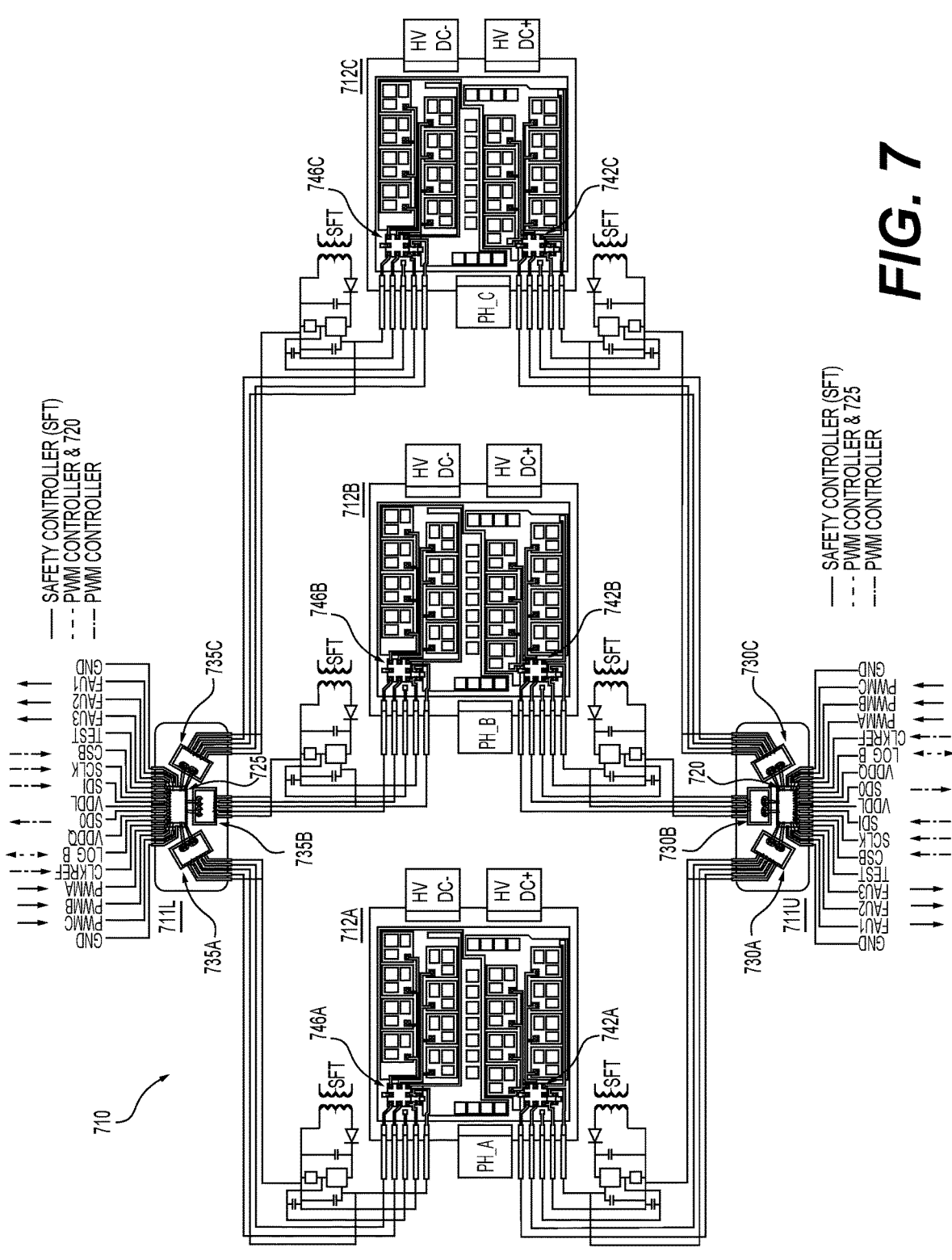
FIG. 7 depicts an exemplary connection diagram for a system including a three channel galvanic isolator and an integrated gate driver architecture, according to one or more embodiments.

FIG. 6 depicts an exemplary block diagram for a system 710 including a three channel galvanic isolator and an integrated gate driver architecture, according to one or more embodiments. FIG. 7 depicts an exemplary connection diagram for a system 710 including a three channel galvanic isolator and an integrated gate driver architecture, according to one or more embodiments.

As shown in FIG. 6 and FIG. 7, system 710 may include upper phase multi-chip module 711U, lower phase multi-chip module 711L, phase A power module 712A, phase B power module 712B, and phase C power module 712C. Upper phase multi-chip module 711U may include low voltage upper phase controller 720, high voltage upper phase A controller 730A, high voltage upper phase B controller 730B, and high voltage upper phase C controller 730C. Lower phase multi-chip module 711L may include low voltage lower phase controller 725, high voltage lower phase A controller 735A, high voltage lower phase B controller 735B, and high voltage lower phase C controller 735C.

As shown in FIG. 7, phase A power module 712A may include a positive power connection (HVDC+), a negative power connection (HVDC−), a phase A connection (PH_A), point-of-use lower phase A controller 746A, lower phase A power switch 748A, point-of-use upper phase A controller 742A, and upper phase A power switch 744A. Phase B power module 712B may include a positive power connection (HVDC+), a negative power connection (HVDC−), a phase B connection (PH_B), point-of-use lower phase B controller 746B, lower phase B power switch 748B, point-of-use upper phase B controller 742B, and upper phase B power switch 744B. Phase C power module 712C may include a positive power connection (HVDC+), a negative power connection (HVDC−), a phase C connection (PH_C), point-of-use lower phase C controller 746C, lower phase C power switch 748C, point-of-use upper phase C controller 742C, and upper phase C power switch 744C.

System 710 may be an implementation of a portion of inverter 110, for example. Upper phase multi-chip module 711U may be an implementation of low voltage upper phase controller 120, high voltage upper phase controller 130, and a galvanic isolator, such as galvanic isolator 150, for example. Lower phase multi-chip module 711L may be an implementation of low voltage lower phase controller 125, high voltage lower phase controller 135, and a galvanic isolator, such as galvanic isolator 150, for example. Phase A power module 712A may be an implementation of upper phase power module 140 and lower phase power module 145, for example. Phase B power module 712B may be an implementation of upper phase power module 140 and lower phase power module 145, for example. Phase C power module 712C may be an implementation of upper phase power module 140 and lower phase power module 145, for example.

Point-of-use upper phase A controller 742A may be an implementation of controller 142A, for example. Point-of-use upper phase B controller 742B may be an implementation of point-of-use upper phase B controller 142B, for example. Point-of-use upper phase C controller 742C may be an implementation of point-of-use upper phase C controller 142C, for example. Similarly, point-of-use lower phase A controller 746A, point-of-use lower phase B controller 746B, and point-of-use lower phase C controller 746C may be implementations of individual phase controllers of point-of-use lower phase controller 146.

Upper phase A power switch 744A may be an implementation of upper phase A switches 144A, for example. Upper phase B power switch 744B may be an implementation of upper phase B switches 144B, for example. Upper phase C power switch 744C may be an implementation of upper phase C switches 144C, for example. Similarly, lower phase A power switch 748A, lower phase B power switch 748B, and lower phase C power switch 748C may be implementations of individual phase power switches of lower phase switches 148.

Low voltage upper phase controller 720, of upper phase multi-chip module 711U, may communicate with one or more of a safety controller, a PWM controller (such as inverter controller 300, for example), or low voltage lower phase controller 725 of lower phase multi-chip module 711L. Based on this communication, low voltage upper phase controller 720 may communicate with high voltage upper phase A controller 730A via upper phase A galvanic isolator 750U-A, high voltage upper phase B controller 730B via upper phase A galvanic isolator 750U-B, and high voltage upper phase C controller 730C via upper phase A galvanic isolator 750U-C.

Based on the communication with low voltage upper phase controller 720, high voltage upper phase A controller 730A may communicate with point-of-use upper phase A controller 742A. Based on this communication with high voltage upper phase A controller 730A, point-of-use upper phase A controller 742A may control upper phase A power switch 744A to control a current between the positive power connection (HVDC+) and phase A connection (PH_A) of phase A power module 712A, which may control a flow of current between a positive terminal of battery 195 and a phase A of motor 190, for example. Point-of-use upper phase A controller 742A may provide information about upper phase A power switch 744A to high voltage upper phase A controller 730A, which may communicate this information to low voltage upper phase controller 720, which may communicate this information to one or more of the safety controller, PWM controller, or low voltage lower phase controller 725 of lower phase multi-chip module 711L.

Based on the communication with low voltage upper phase controller 720, high voltage upper phase B controller 730B may communicate with point-of-use upper phase B controller 742B. Based on this communication with high voltage upper phase B controller 730B, point-of-use upper phase B controller 742B may control upper phase B power switch 744B to control a current between the positive power connection (HVDC+) and phase B connection (PH_B) of phase B power module 712B, which may control a flow of current between a positive terminal of battery 195 and a phase B of motor 190, for example. Point-of-use upper phase B controller 742B may provide information about upper phase B power switch 744B to high voltage upper phase B controller 730B, which may communicate this information to low voltage upper phase controller 720, which may communicate this information to one or more of the safety controller, PWM controller, or low voltage lower phase controller 725 of lower phase multi-chip module 711L.

Based on the communication with low voltage upper phase controller 720, high voltage upper phase C controller 730C may communicate with point-of-use upper phase C controller 742C. Based on this communication with high voltage upper phase C controller 730C, point-of-use upper phase C controller 742C may control upper phase C power switch 744C to control a current between the positive power connection (HVDC+) and phase C connection (PH_C) of phase C power module 712C, which may control a flow of current between a positive terminal of battery 195 and a phase C of motor 190, for example. Point-of-use upper phase C controller 742C may provide information about upper phase C power switch 744C to high voltage upper phase C controller 730C, which may communicate this information to low voltage upper phase controller 720, which may communicate this information to one or more of the safety controller, PWM controller, or low voltage lower phase controller 725 of lower phase multi-chip module 711L.

Low voltage lower phase controller 725, of lower phase multi-chip module 711L, may communicate with one or more of a safety controller, a PWM controller (such as inverter controller 300, for example), or low voltage upper phase controller 720 of upper phase multi-chip module 711U. Based on this communication, low voltage lower phase controller 725 may communicate with high voltage lower phase A controller 735A via lower phase A galvanic isolator 750L-A, high voltage lower phase B controller 735B via lower phase A galvanic isolator 750L-B, and high voltage lower phase C controller 735C via lower phase A galvanic isolator 750L-C.

Based on the communication with low voltage lower phase controller 725, high voltage lower phase A controller 735A may communicate with point-of-use lower phase A controller 746A. Based on this communication with high voltage lower phase A controller 735A, point-of-use lower phase A controller 746A may control lower phase A power switch 748A to control a current between the negative power connection (HVDC−) and phase A connection (PH_A) of phase A power module 712A, which may control a flow of current between a negative terminal of battery 195 and a phase A of motor 190, for example. Point-of-use lower phase A controller 746A may provide information about lower phase A power switch 748A to high voltage lower phase A controller 735A, which may communicate this information to low voltage lower phase controller 725, which may communicate this information to one or more of the safety controller, PWM controller, or low voltage upper phase controller 720 of upper phase multi-chip module 711U.

Based on the communication with low voltage lower phase controller 725, high voltage lower phase B controller 735B may communicate with point-of-use lower phase B controller 746B. Based on this communication with high voltage lower phase B controller 735B, point-of-use lower phase B controller 746B may control associated lower phase B power switch 748B to control a current between the negative power connection (HVDC−) and phase B connection (PH_B) of phase B power module 712B, which may control a flow of current between a negative terminal of battery 195 and a phase B of motor 190, for example. Point-of-use lower phase B controller 746B may provide information about lower phase B power switch 748B to high voltage lower phase B controller 735B, which may communicate this information to low voltage lower phase controller 725, which may communicate this information to one or more of the safety controller, PWM controller, or low voltage upper phase controller 720 of upper phase multi-chip module 711U.

Based on the communication with low voltage lower phase controller 725, high voltage lower phase C controller 735C may communicate with point-of-use lower phase C controller 746C. Based on this communication with high voltage lower phase C controller 735C, point-of-use lower phase C controller 746C may control lower phase C power switch 748C to control a current between the negative power connection (HVDC−) and phase C connection (PH_C) of phase C power module 712C, which may control a flow of current between a negative terminal of battery 195 and a phase C of motor 190, for example. Point-of-use lower phase C controller 746C may provide information about lower phase C power switch 748C to high voltage lower phase C controller 735C, which may communicate this information to low voltage lower phase controller 725, which may communicate this information to one or more of the safety controller, PWM controller, or low voltage upper phase controller 720 of upper phase multi-chip module 711U.

System 710 may integrate point-of-use upper phase B controller 742B, for example, into phase B power module 712B. Point-of-use upper phase B controller 742B may be an application-specific integrated circuit (ASIC), for example. Phase B power module 712B may include upper phase B power switch 744B and lower phase B power switch 748B, and may incorporate point-of-use upper phase B controller 742B and point-of-use lower phase B controller 746B to control upper phase B power switch 744B and lower phase B power switch 748B, respectively. One or more of upper phase B power switch 744B and lower phase B power switch 748B may include one or more SiC dies. Point-of-use upper phase B controller 742B, for example, may locally sense a current of an SiC die by sensing a voltage drop across the source metallization. Point-of-use upper phase B controller 742B may include local precision thermal sensing of the SiC die and an environment of the SiC die, without the need for integrated on die temperature sense circuitry, which may provide improved die thermal performance or lower die cost. Phase B power module 712B may closely couple gate drive circuitry of point-of-use upper phase B controller 742B, for example, to one or more SiC bare dies that make up upper phase B power switch 744B, which may reduce switching losses.

Point-of-use upper phase B controller 742B may include a gate drive profile as a function of one or more of SiC FET gate-to-source voltage, temperature, or known gate-to-source voltage thresholds that may change over the life of the SiC FET. Point-of-use upper phase B controller 742B may measure and store specific SiC device characteristics in a memory of the integrated gate driver, and may provide custom tailored gate drive profiles based on the stored SiC device characteristics. Point-of-use upper phase B controller 742B may use a two-wire bus for communication, which may reduce a number of connections to a galvanic isolated device. System 710 may provide a three HVIC to one LVIC using upper phase multi-chip module 711U for upper switches of a three-phase bridge and lower phase multi-chip module 711L for lower switches of a three-phase bridge.

Point-of-use upper phase B controller 742B may provide direct current sensing, which may provide less stress on SiC devices in the event of a short circuit event. Point-of-use upper phase B controller 742B may provide precise temperature measurement, which may allow operation at a higher average temperature for system optimization. Point-of-use upper phase B controller 742B may reduce switching losses due to one or more of a tightly coupled layout, usage of SiC device characteristics, usage of temperature, and usage of previous cycle current. Reduced switching losses may provide an increased range for an electric vehicle. Reduced switching losses may provide a higher current output of the power switch or module. System 710 may provide safety independence as required in permanent magnet machines for active short circuit discharge during device failure. The above description uses phase B power module 712B and point-of-use upper phase B controller 742B as an example, and similar description may also apply to phase A power module 712A and phase C power module 712C and associated components.

One or more embodiments may integrate a gate driver into the power switch, as an integrated gate driver or point-of-use controller. The integrated gate driver may be an application-specific integrated circuit (ASIC), for example. A phase switch power module that includes two switches may incorporate two integrated gate drivers. One or more embodiments may locally sense current of a SiC die by sensing a voltage drop across the source metallization. One or more embodiments may include local precision thermal sensing of the SiC die and an environment of the SiC die, without the need for integrated on die temperature sense circuitry, which may provide improved die thermal performance or lower die cost. One or more embodiments may closely couple gate drive circuitry to the SiC bare die that makes up the power switch, which may reduce switching losses. One or more embodiments may include a gate drive profile as a function of one or more of SiC FET gate-to-source voltage, temperature, or known gate-to-source voltage thresholds that may change over the life of the SiC FET. One or more embodiments may measure and store specific SiC device characteristics in a memory, such as an EEPROM, for example, of the integrated gate driver, and may provide custom tailored gate drive profiles based on the stored SiC device characteristics. One or more embodiments may use a two-wire bus for communication, which may reduce a number of connections to a galvanic isolated device. One or more embodiments may provide a three HVIC to one LVIC using a first multi-chip module for upper switches of a three-phase bridge and a second multi-chip module for lower switches of a three-phase bridge.

One or more embodiments may provide direct current sensing, which may provide less stress on SiC devices in the event of a short circuit event. One or more embodiments may provide precise temperature measurement, which may allow operation at a higher average temperature for system optimization. One or more embodiments may reduce switching losses due to one or more of a tightly coupled layout, usage of SiC device characteristics, usage of temperature, and usage of previous cycle current. Reduced switching losses may provide an increased range for an electric vehicle. Reduced switching losses may provide a higher current output of the power switch or module. One or more embodiments may provide safety independence as required in permanent magnet machines for active short circuit discharge during device failure.

One or more embodiments may provide a single multi-chip module package component with three galvanically isolated channels that interface between the low voltage chassis referenced ground domain and each of three integrated gate drivers located in the high voltage battery domain. This three channel configuration may provide an architecture with one package part controlling either the three upper phase switches or three lower phase switches of a three-phase inverter. One or more embodiments may provide an improved arrangement from a functional safety standpoint, as safe responses for an inverter may include either three phase short of the upper or lower switches or a six-switch open condition. For example, a single point failure that affects the multi-chip module controlling the three upper switches may allow a safe state to be entered by the lower multi-chip module executing a three-phase short on the lower three switches. One or more embodiments may reduce a number of packaged galvanic isolators placed in the system from some system requirements of six, in the case of a three-phase system, to two multi-chip modules. One or more embodiments may reduce a number of Serial Peripheral Interface (SPI connections to control a three-phase switch.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
an upper phase multi-chip module including:
a low-voltage upper phase controller;
a high-voltage upper phase A controller;
an upper phase A galvanic isolator connecting the low-voltage upper phase controller to the high-voltage upper phase A controller;
a high-voltage upper phase B controller;
an upper phase B galvanic isolator connecting the low-voltage upper phase controller to the high-voltage upper phase B controller;
a high-voltage upper phase C controller; and
an upper phase C galvanic isolator connecting the low-voltage upper phase controller to the high-voltage upper phase C controller.

2. The system of claim 1, wherein the inverter further includes:
a point-of-use upper phase A controller configured to be connected to the high-voltage upper phase A controller;
a point-of-use upper phase B controller configured to be connected to the high-voltage upper phase B controller; and
a point-of-use upper phase C controller configured to be connected to the high-voltage upper phase C controller.

3. The system of claim 2, wherein the inverter further includes:
an upper phase A power switch connected to the point-of-use upper phase A controller, and configured to be connected to a positive connection of the battery and a phase A connection of the motor;
an upper phase B power switch connected to the point-of-use upper phase B controller, and configured to be connected to the positive connection of the battery and a phase B connection of the motor; and
an upper phase C power switch connected to the point-of-use upper phase C controller, and configured to be connected to the positive connection of the battery and a phase C connection of the motor.

4. The system of claim 1, wherein the inverter further includes:
a lower phase multi-chip module including:
a low-voltage lower phase controller;
a high-voltage lower phase A controller;
a lower phase A galvanic isolator connecting the low-voltage lower phase controller to the high-voltage lower phase A controller;
a high-voltage lower phase B controller;
a lower phase B galvanic isolator connecting the low-voltage lower phase controller to the high-voltage lower phase B controller;
a high-voltage lower phase C controller; and
a lower phase C galvanic isolator connecting the low-voltage lower phase controller to the high-voltage lower phase C controller.

5. The system of claim 4, wherein the inverter further includes:
a point-of-use lower phase A controller configured to be connected to the high-voltage lower phase A controller;
a point-of-use lower phase B controller configured to be connected to the high-voltage lower phase B controller; and
a point-of-use lower phase C controller configured to be connected to the high-voltage lower phase C controller.

6. The system of claim 5, wherein the inverter further includes:
a lower phase A power switch connected to the point-of-use lower phase A controller, and configured to be connected to a negative connection of the battery and a phase A connection of the motor;
a lower phase B power switch connected to the point-of-use lower phase B controller, and configured to be connected to the negative connection of the battery and a phase B connection of the motor; and
a lower phase C power switch connected to the point-of-use lower phase C controller, and configured to be connected to the negative connection of the battery and a phase C connection of the motor.

7. The system of claim 1, wherein the inverter further includes:
a phase A power module configured to be connected to the high-voltage upper phase A controller;
a phase B power module configured to be connected to the high-voltage upper phase B controller; and
a phase C power module configured to be connected to the high-voltage upper phase C controller.

8. The system of claim 1, further comprising:
the battery configured to supply the DC power to the inverter; and
the motor configured to receive the AC power from the inverter to drive the motor.

9. A system comprising:

a multi-chip module for an inverter, the multi-chip module including:

a low-voltage controller;

a first high-voltage controller;

a first galvanic isolator connecting the low-voltage controller to the first high-voltage controller;

a second high-voltage controller;

a second galvanic isolator connecting the low-voltage controller to the second high-voltage controller;

a third high-voltage controller; and a third galvanic isolator connecting the low-voltage controller to the third high-voltage controller.

10. The system of claim 9, wherein the low-voltage controller is configured to communicate with a pulse-width-modulation controller of the inverter.

11. The system of claim 10, wherein:

the first high-voltage controller is configured to communicate with a first point-of-use controller on a first power module of the inverter;

the second high-voltage controller is configured to communicate with a second point-of-use controller on a second power module of the inverter; and the third high-voltage controller is configured to communicate with a third point-of-use controller on a third power module of the inverter.

12. The system of claim 11, wherein:

the low-voltage controller is configured to receive a first control signal from the pulse-width-modulation controller, and, based on the first control signal, send a first gate control signal to the first high-voltage controller via the first galvanic isolator;

the low-voltage controller is configured to receive a second control signal from the pulse-width-modulation controller, and, based on the second control signal, send a second gate control signal to the second high-voltage controller via the second galvanic isolator; and the low-voltage controller is configured to receive a third control signal from the pulse-width-modulation controller, and, based on the third control signal, send a third gate control signal to the third high-voltage controller via the third galvanic isolator.

13. The system of claim 12, wherein:

the first high-voltage controller is configured to send the first gate control signal to the first point-of-use controller on the first power module of the inverter;

the second high-voltage controller is configured to send the second gate control signal to the second point-of-use controller on the second power module of the inverter; and the third high-voltage controller is configured to send the third gate control signal to the third point-of-use controller on the third power module of the inverter.

14. The system of claim 13, wherein:

the first high-voltage controller is configured to receive a first feedback signal from the first point-of-use controller on the first power module of the inverter, and send the first feedback signal to the low-voltage controller;

the second high-voltage controller is configured to receive a second feedback signal from the second point-of-use controller on the second power module of the inverter, and send the second feedback signal to the low-voltage controller; and the third high-voltage controller is configured to receive a third feedback signal from the third point-of-use controller on the third power module of the inverter, and send the third feedback signal to the low-voltage controller.

15. A system comprising:

an inverter configured to convert DC power from a battery to AC power to drive a motor, wherein the inverter includes:

an upper phase controller including a low voltage upper phase controller, a first high-voltage upper phase controller, a second high-voltage upper phase controller, and a third high-voltage upper phase controller;

a lower phase controller including a low voltage lower phase controller, a first high-voltage lower phase controller, a second high-voltage lower phase controller, and a third high-voltage lower phase controller;

a first power module including a first upper phase point-of-use controller, a first upper phase switch, a first lower phase point-of-use controller, and a first lower phase switch;

a second power module including a second upper phase point-of-use controller, a second upper phase switch, a second lower phase point-of-use controller, and a second lower phase switch; and a third power module including a third upper phase point-of-use controller, a third upper phase switch, a third lower phase point-of-use controller, and a third lower phase switch.

16. The system of claim 15, wherein:

the upper phase controller is configured to communicate with a pulse-width-modulation controller of the inverter, and is configured to communicate with the lower phase controller, and the lower phase controller is configured to communicate with the pulse-width-modulation controller of the inverter, and is configured to communicate with the upper phase controller.

17. The system of claim 15, wherein:

the first high-voltage upper phase controller includes a first upper phase galvanic isolator connected to the low voltage upper phase controller;

the second high-voltage upper phase controller includes a second upper phase galvanic isolator connected to the low voltage upper phase controller;

the third high-voltage upper phase controller includes a third upper phase galvanic isolator connected to the low voltage upper phase controller;

the first high-voltage lower phase controller includes a first lower phase galvanic isolator connected to the low voltage lower phase controller;

the second high-voltage lower phase controller includes a second lower phase galvanic isolator connected to the low voltage lower phase controller; and the third high-voltage lower phase controller includes a third lower phase galvanic isolator connected to the low voltage lower phase controller.

18. The system of claim 17, wherein:

the first high-voltage upper phase controller is configured to be connected to the first upper phase point-of-use controller;

the second high-voltage upper phase controller is configured to be connected to the second upper phase point-of-use controller;

the third high-voltage upper phase controller is configured to be connected to the third upper phase point-of-use controller;

the first high-voltage lower phase controller is configured to be connected to the first lower phase point-of-use controller;

the second high-voltage lower phase controller is configured to be connected to the second lower phase point-of-use controller; and the third high-voltage lower phase controller is configured to be connected to the third lower phase point-of-use controller.

19. The system of claim 18, wherein:

the first upper phase point-of-use controller is configured to control the first upper phase switch based on one or more first upper phase signals from the first high-voltage upper phase controller;

the second upper phase point-of-use controller is configured to control the second upper phase switch based on one or more second upper phase signals from the second high-voltage upper phase controller;

the third upper phase point-of-use controller is configured to control the third upper phase switch based on one or more third upper phase signals from the third high-voltage upper phase controller;

the first lower phase point-of-use controller is configured to control the first lower phase switch based on one or more first lower phase signals from the first high-voltage lower phase controller;

the second lower phase point-of-use controller is configured to control the second lower phase switch based on one or more second lower phase signals from the second high-voltage lower phase controller; and the third lower phase point-of-use controller is configured to control the third lower phase switch based on one or more third lower phase signals from the third high-voltage lower phase controller.

20. The system of claim 15, wherein:

the first upper phase switch is configured to be connected to a positive connection of the battery and a first phase connection of the motor;

the second upper phase switch is configured to be connected to a positive connection of the battery and a second phase connection of the motor;

the third upper phase switch is configured to be connected to a positive connection of the battery and a third phase connection of the motor;

the first lower phase switch is configured to be connected to a negative connection of the battery and the first phase connection of the motor;

the second lower phase switch is configured to be connected to a negative connection of the battery and the second phase connection of the motor; and the third lower phase switch is configured to be connected to a negative connection of the battery and the third phase connection of the motor.

* * * * *